United States Patent
Jung

(10) Patent No.: US 8,817,557 B2
(45) Date of Patent: Aug. 26, 2014

(54) SEMICONDUCTOR MEMORY DEVICE AND AN OPERATION METHOD THEREOF

(75) Inventor: Jeongsu Jung, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 136 days.

(21) Appl. No.: 13/494,642

(22) Filed: Jun. 12, 2012

(65) Prior Publication Data
US 2013/0329506 A1    Dec. 12, 2013

(51) Int. Cl.
*G11C 7/00* (2006.01)
*G11C 8/00* (2006.01)

(52) U.S. Cl.
USPC ............... 365/194; 365/189.16; 365/189.17; 365/230.03

(58) Field of Classification Search
USPC ............ 365/194, 189.16, 189.17, 230.03
See application file for complete search history.

(56) References Cited

U.S. PATENT DOCUMENTS

| | | | | |
|---|---|---|---|---|
| 6,055,208 A | * | 4/2000 | Morgan et al. | 365/194 |
| 6,304,511 B1 | * | 10/2001 | Gans et al. | 365/194 |
| 6,385,078 B2 | * | 5/2002 | Jeon | 365/194 |
| 6,438,043 B2 | * | 8/2002 | Gans et al. | 365/194 |
| 6,717,887 B1 | * | 4/2004 | Kono et al. | 365/194 |
| 6,768,698 B2 | * | 7/2004 | Kono | 365/194 |
| 6,909,658 B2 | * | 6/2005 | Arimoto et al. | 365/194 |
| 7,058,776 B2 | * | 6/2006 | Lee | 365/194 |
| 7,196,949 B2 | * | 3/2007 | Park | 365/194 |
| 7,451,360 B2 | * | 11/2008 | Kim et al. | 365/194 |
| 7,969,765 B2 | * | 6/2011 | Sekiguchi et al. | 365/230.03 |
| 8,107,302 B2 | * | 1/2012 | Park | 365/194 |
| 8,238,191 B2 | * | 8/2012 | Yu | 365/194 |

* cited by examiner

*Primary Examiner* — Trong Phan
(74) *Attorney, Agent, or Firm* — IP & T Group LLP

(57) ABSTRACT

A semiconductor memory device includes: a data transfer line coupled with a plurality of memory cell arrays corresponding to an address; an enable signal delayer configured to generate an enable signal by reflecting a delay amount corresponding to the address into an internal command signal corresponding to a column command; and a data exchange block configured to exchange data with the data transfer line in response to the enable signal.

16 Claims, 5 Drawing Sheets

SEMICONDUCTOR MEMORY DEVICE AND AN OPERATION METHOD THEREOF

BACKGROUND

1. Field

Exemplary embodiments of the present invention relate to a semiconductor designing technology, and more particularly, to a semiconductor memory device that performs a data write operation and a data read operation.

2. Description of the Related Art

Generally, semiconductor devices including a Double Data Rate Synchronous Dynamic Random Access Memory Device (DDR SDRAM) device store an external data in a memory cell through a write operation or outputs a data stored in a memory cell to the outside through a read operation.

FIG. 1 is a block diagram illustrating a typical semiconductor memory device.

Referring to FIG. 1, the semiconductor memory device includes a first memory cell array 110_1, an $N^{th}$ memory cell array 110_N, a read sense amplifier 120, a data pad 130, a write driver 140, and an enable signal generator 150.

A plurality of memory cell arrays including first to $N^{th}$ memory cell arrays 110_1, . . . , 110_N are constituent elements for storing data, and they include a great deal of memory cells. Each memory cell may be selected by one word line and one column selection signal (not shown), and a data may be stored in a selected memory cell or a data stored in a selected memory cell is outputted according to the write operation and the read operation of the semiconductor memory device.

In FIG. 1, the first memory cell array 110_1 and the $N^{th}$ memory cell array 110_N among the multiple memory cells are illustrated. Among a plurality of word lines coupled with the first memory cell array 110_1, a first word line WL1 is illustrated representatively, and among a plurality of word lines coupled with the $N^{th}$ memory cell array 110_N, an $N^{th}$ word line WLN is illustrated representatively.

The read sense amplifier 120 receives the data outputted from the first to $N^{th}$ memory cell arrays 110_1, . . . , 110_N through primary/secondary data transfer lines IO and IOB during a read operation, sense-amplifies the data, outputs the sense-amplified data to the data pad 130. The write driver 140 receives the data transferred through the data pad 130 during a write operation, and drives the primary/secondary data transfer lines IO and IOB coupled with the first to $N^{th}$ memory cell arrays 110_1, . . . , 110_N.

The enable signal generator 150 controls the enabling operations of the read sense amplifier 120 and the write driver 140 during the read and write operations. The enable signal generator 150 generates a read enabling signal EN_RD and a write enabling signal EN_WR in response to an internal command pulse signal BYPREP. Herein, the internal command pulse signal BYPREP is a signal enabled in response to an external read command or an external write command. The read enabling signal EN_RD is a signal for controlling the enabling operation of the read sense amplifier 120, and the write enabling signal EN_WR is a signal for controlling the enabling operation of the write driver 140.

FIG. 2 is a waveform diagram describing a read operation of the semiconductor memory device shown in FIG. 1. For the sake of convenience in description, a data corresponding to a first word line WL1 and transferred the read sense amplifier 120 is referred to as a first data IO/IOB@WL1, and a data corresponding to an $N^{th}$ word line WLN and transferred the read sense amplifier 120 through the primary/secondary data transfer lines IO and IOB is referred to as an $N^{th}$ data IO/IOB@WLN.

As illustrated in FIG. 1, a plurality of memory cell arrays are disposed between the first memory cell array 110_1 and the $N^{th}$ memory cell array 110_N. This signifies that the first memory cell array 110_1 and the $N^{th}$ memory cell array 110_N are disposed apart from each other, and also the primary/secondary data transfer lines IO and IOB are disposed longitudinally corresponding to the first memory cell array 110_1 and the $N^{th}$ memory cell array 110_N. Therefore, the moment that the first data IO/IOB@WL1 arrives at the read sense amplifier 120 after the first word line WL1 is enabled and the moment when the $N^{th}$ data TO/IOB@WLN arrives at the read sense amplifier 120 after the $N^{th}$ word line WLN is enabled are different.

Referring to FIGS. 1 and 2, the first memory cell array 110_1 is disposed farther than the $N^{th}$ memory cell array 110_N from the read sense amplifier 120. Thus, the $N^{th}$ data IO/IOB@WLN is transferred to the read sense amplifier 120 earlier than the first data IO/IOB@WL1, and the first data IO/IOB@WL1 is transferred to the read sense amplifier 120 later than the $N^{th}$ data IO/IOB@WLN.

Meanwhile, the enabling moment of the read enabling signal EN_RD enabled during a read operation is generally designed based on the data that is transferred latest to the read sense amplifier 120. In other words, the enabling moment of the read enabling signal EN_RD is designed based on the first data IO/IOB@WL1 that is transferred latest to the read sense amplifier 120. Therefore, the $N^{th}$ data IO/IOB@WLN, which is transferred earliest, comes to have a reduced margin with an enabling control signal CTR_AT.

As the semiconductor memory devices are being integrated higher and higher, the number of memory cell arrays for storing data is increasing more and more. The increasing number of memory cell arrays signifies that the transfer time difference between the data transferred to the read sense amplifier 120 is becoming greater, and as illustrated in FIG. 2, the increase in the transfer time difference deteriorates the margin between the read enabling signal EN_RD and the data transferred earliest.

SUMMARY

An embodiment of the present invention is directed to a semiconductor memory device that may control the delay amount of an enabling signal based on the position of a memory cell array.

In accordance with an embodiment of the present invention, a semiconductor memory device includes: a data transfer line coupled with a plurality of memory cell arrays corresponding to an address; an enable signal delayer configured to generate an enable signal by reflecting a delay amount corresponding to the address into an internal command signal corresponding to a column command; and a data exchange block configured to exchange data with the data transfer line in response to the enable signal.

The semiconductor memory device may further include: an address decoder configured to select a word line for the multiple memory cell arrays in response to the address.

In accordance with another embodiment of the present invention, a semiconductor memory device includes: a data exchange block configured to exchange data with a data transfer line in response to an enable signal; a first memory cell array disposed with a first distance from the data exchange block and transferring/receiving data to/from the data transfer line; a second memory cell array disposed with a second distance from the data exchange block, where the second distance is longer than the first distance, and transferring/receiving data to/from the data transfer line; and an enable signal delayer configured to generate the enable signal by reflecting a delay amount corresponding to the first and second distances into an internal command signal corresponding to a column command.

The semiconductor memory device may further include: a row address decoder configured to select a word line for the first and second memory cell arrays in response to a row address. The enable signal delayer may delay the internal command signal based on the row address.

In accordance with yet another embodiment of the present invention, a method for operating a semiconductor memory device includes: measuring a length of a transfer line between each of a plurality of memory cell array and a data exchange block; controlling a delay amount of an internal command signal corresponding to a column command based on the measured value; and latching a data corresponding to a memory cell array among the multiple memory cell arrays in response to the internal command signal.

The delay amount may be decided based on an address of each of the multiple memory cell arrays.

In accordance with still another embodiment of the present invention, a semiconductor memory device includes: first and second data transfer lines coupled with first and second edge memory cell arrays corresponding to an address; an enable signal delayer configured to generate a first enable signal and a second enable signal out of a column command by reflecting a different delay amount corresponding to the address into the column command; and a data exchange block configured to exchange data with the first and second data transfer lines in response to the first and second enable signals, respectively.

The first and second edge memory cell arrays may have an open-bit line structure.

Since the delay amount of an enabling signal may be controlled based on the position of a memory cell array in accordance with an embodiment of the present invention, it is possible to sufficiently secure the margin between an input/output data and a control signal for controlling the input/output data.

DETAILED DESCRIPTION

Figure 1:
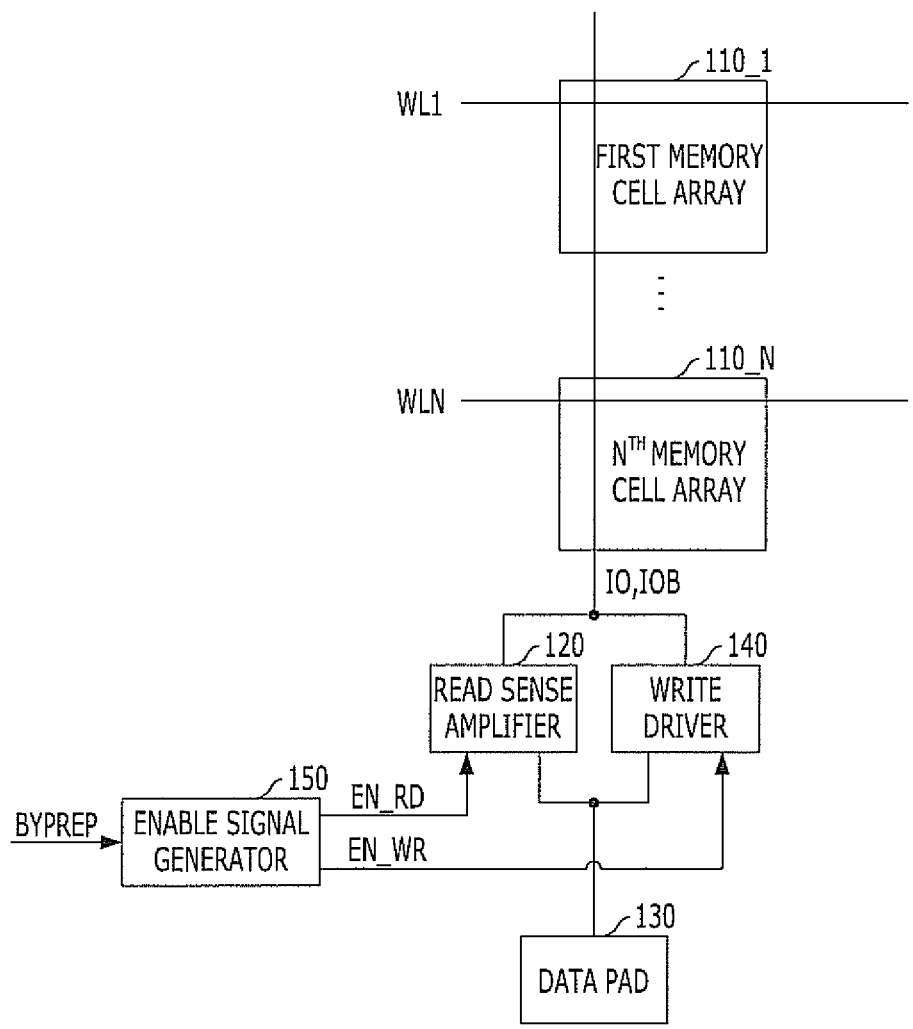
FIG. 1 is a block diagram illustrating a typical semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
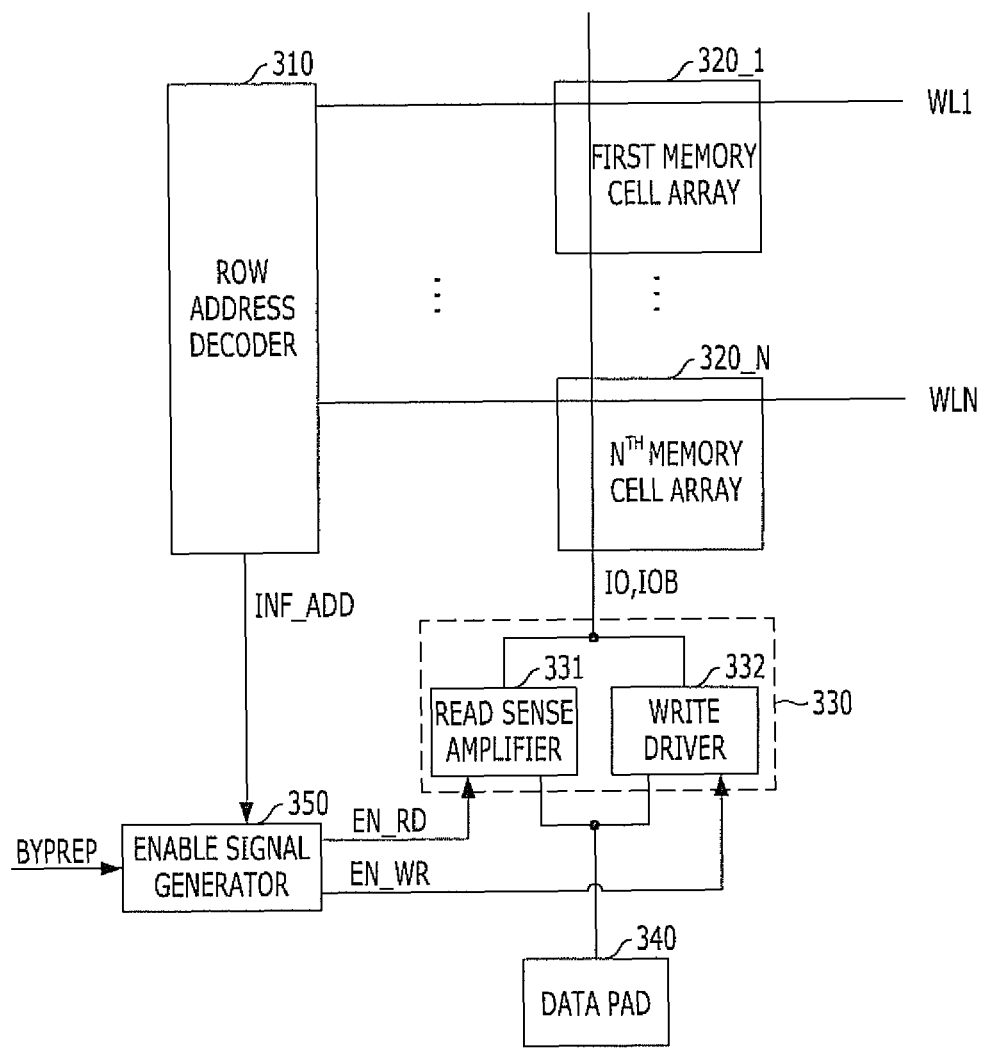
FIG. 3 is a block diagram illustrating a semiconductor memory device in accordance with an embodiment of the present invention.

FIG. 3 is a block diagram illustrating a semiconductor memory device in accordance with an embodiment of the present invention.

Referring to FIG. 3, the semiconductor memory device includes a row address decoder 310, a first memory cell array 320_1, an $N^{th}$ memory cell array 320_N, a data exchange block 330, a data pad 340, and an enable signal generator 350.

The row address decoder 310 receives an external address (not shown), decodes the received external address, and selectively enables a plurality of word lines WL1, ..., WLN, .... Subsequently, a plurality of memory cell arrays including first to $N^{th}$ memory cell arrays 320_1, ..., 320_N store a data in a memory cell corresponding to the address.

Herein, each memory cell may be selected based on one word line and one column selection signal (not shown), and a data may be stored in the selected memory cell or the data stored in the selected memory cell may be outputted according to the write or operation or read operation of the semiconductor memory device. Herein, the first memory cell array 320_1 and the $N^{th}$ memory cell array 320_N among the multiple memory cell arrays are illustrated in FIG. 3. Among the multiple word lines coupled with the first memory cell array 320_1, a first word line WL1 is illustrated representatively, and an $N^{th}$ word line WLN is illustrated representatively among the multiple word lines coupled with the $N^{th}$ memory cell array 320_N.

The data exchange block 330 exchanges data with primary/secondary data transfer lines IO and IOB in response to a read enabling signal EN_RD and a write enabling signal EN_WR, and the data exchange block 330 includes a read sense amplifier 331 and a write driver 332.

Herein, the read sense amplifier 331 receives the data outputted from the first to $N^{th}$ memory cell arrays 320_1, ..., 320_N through the primary/secondary data transfer lines IO and IOB during a read operation, sense-amplifies the received data, outputs the sense-amplified data through the data pad 340. The write driver 332 receives the data transferred through the data pad 340 and drives the primary/secondary data transfer lines IO and IOB coupled with the first to $N^{th}$ memory cell arrays 320_1, ..., 320_N during a write operation.

The enable signal generator 350 generates a read enabling signal EN_RD and a write enabling signal EN_WR by reflecting a delay amount corresponding to address information INF_ADD into an internal command pulse signal BYPREP corresponding to a column command. Herein, the address information INF_ADD signifies information on the word line of the first to $N^{th}$ memory cell arrays 320_1, ..., 320_N. On the other hand, the address information INF_ADD signifies information on the length of a transfer line between each of the first to $N^{th}$ memory cell arrays 320_1, ..., 320_N and the read sense amplifier 331.

Herein, the enable signal generator 350 may be designed diversely. For example, the enable signal generator 350 may be designed to receive some bits of a row address formed of multiple bits and to delay the internal command pulse signal BYPREP as much as a delay amount corresponding to the received bits. Also, it is possible to measure the length of the transfer line between each of the multiple memory cell arrays and the read sense amplifier 331 through an independent operation mode such as a test operation mode and control the delay amount of the internal command pulse signal BYPREP based on the measured value. The length of the transfer line may be measured through diverse methods. In this embodiment of the present invention, the length of the transfer line between a memory cell array and the read sense amplifier 331 is measured based on a row address. For example, the length of the transfer line is measured by using the uppermost bit of the row address or by using the bit of an address that may represent a plurality of memory cell arrays grouped according to the position.

After all, the semiconductor memory device in accordance with the embodiment of the present invention may control the delay amounts of the read enabling signal EN_RD and the write enabling signal EN_WR based on the address information INF_ADD. Through the process, the margin between an input/output data and a control signal for controlling the input/output data may be sufficiently secured, which will be described later on.

Figure 4:
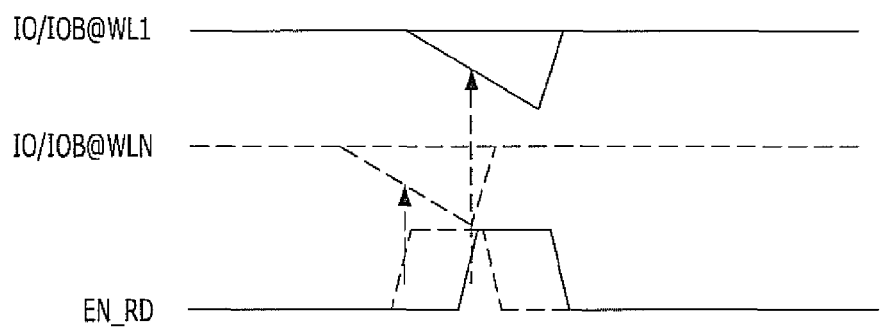
FIG. 4 is a waveform diagram describing a read operation of the semiconductor memory device shown in FIG. 3.

FIG. 4 is a waveform diagram describing a read operation of the semiconductor memory device shown in FIG. 3. For the sake of convenience in description, the data transferred to the read sense amplifier 331 after the first word line WL1 is enabled is referred to as a first data IO/IOB@WL1, and the data transferred to the read sense amplifier 331 after the $N^{th}$ word line WLN is enabled is referred to as an $N^{th}$ data IO/IOB@WLN, hereafter.

Figure 2:
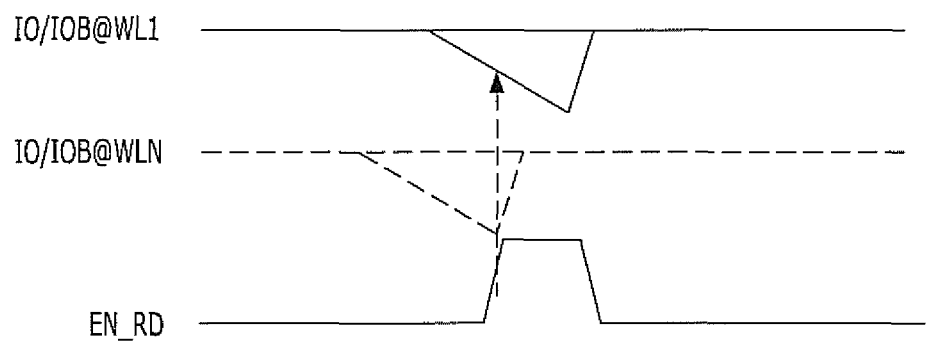
FIG. 2 is a waveform diagram describing a read operation of the semiconductor memory device shown in FIG. 1.

Just as described with reference to FIG. 2, the first data IO/IOB@WL1 and the $N^{th}$ data IO/IOB@WLN of FIG. 4 are transferred to the read sense amplifier 331 at different moments because the distance between the first memory cell array 320_1 and the read sense amplifier 331 and the distance between the $N^{th}$ memory cell array 320_N and the read sense amplifier 331 are different from each other. In short, the $N^{th}$ data IO/IOB@WLN is transferred to the read sense amplifier 331 at first, and the first data IO/IOB@WL1 is transferred to the read sense amplifier 331 later.

The enable signal generator 350 in accordance with the embodiment of the present invention generates the read enabling signal EN_RD by reflecting a delay amount corresponding to the address information INF_ADD into the internal command pulse signal BYPREP. In other words, the enable signal generator 350 generates the read enabling signal EN_RD (see solid line) corresponding to the first data IO/IOB@WL1 by delaying the internal command pulse signal BYPREP based on the address information INF_ADD corresponding to the first word line WL1, and generates the read enabling signal EN_RD (see dotted line) corresponding to the $N^{th}$ data IO/IOB@WLN by delaying the internal command pulse signal BYPREP based on the address information INF_ADD corresponding to the $N^{th}$ word line WLN. As shown in the drawing, the first data IO/IOB@WL1 and the read enabling signal EN_RD (see solid line) have a sufficient margin, and the $N^{th}$ data IO/IOB@WLN and the read enabling signal EN_RD (see dotted line) also have a sufficient margin as well. After all, in this embodiment of the present invention, the data outputted during a read operation and the read enabling signal EN_RD, which is a control signal for controlling the data outputted during the read operation, have a sufficient margin. This signifies that a data may be sufficiently latched based on a corresponding control signal.

In the meantime, the reason why the first data IO/IOB@WL1 and the $N^{th}$ data IO/IOB@WLN are transferred to the read sense amplifier 331 at different moments is not just because the distance between the first memory cell array 320_1 and the read sense amplifier 331 is different from the distance between the $N^{th}$ memory cell array 320_N and the read sense amplifier 331. To be specific, a memory cell array outputs a data selected in response to a column selection signal through the primary/secondary data transfer lines IO and IOB during a read operation. Herein, a circuit that generates the column selection signal is disposed in one side [of what?] based on the memory cell array. For this reason, the time taken for the column selection signal to be enabled and arrive at the memory cell array becomes different for each of the multiple memory cell arrays. Herein, the fact that the column selection signal arrives at the memory cell arrays at different moments means that the data outputted from the memory cell arrays are applied to the primary/secondary data transfer lines IO and IOB at different moments. This signifies that the data arrive at the read sense amplifier 331 at different moments.

Figure 5:
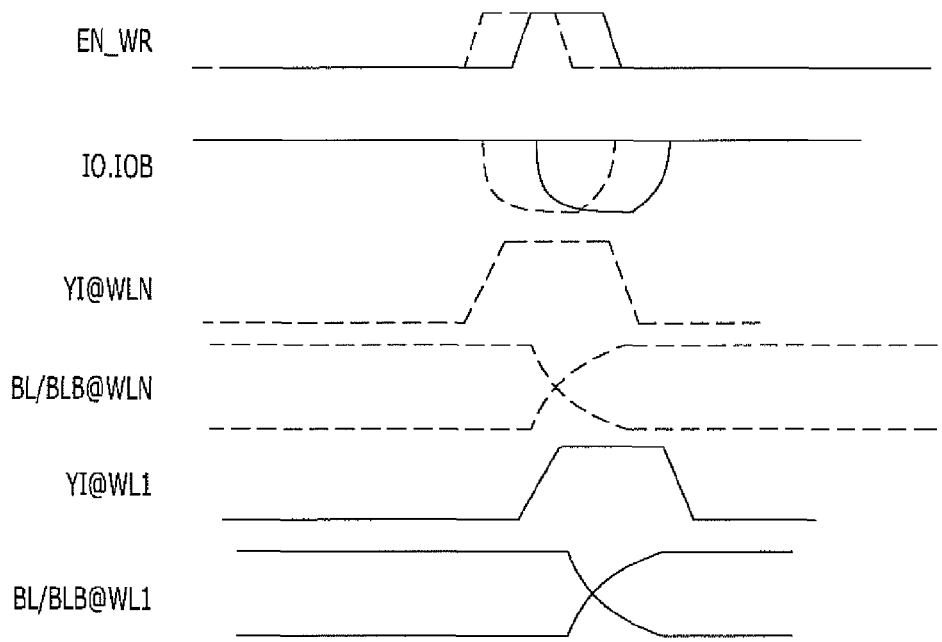
FIG. 5 is a waveform diagram describing a write operation of a semiconductor memory device in accordance with an embodiment of the present invention.

FIG. 5 is a waveform diagram describing a write operation of a semiconductor memory device in accordance with an embodiment of the present invention. Herein, a case where a column selection signal arrives at a different moment for each memory cell array as illustrated above is described in FIG. 5. The column selection signal corresponding to the first word line WL1 is referred to as a first column selection signal YI@WL1, and the column selection signal corresponding to the $N^{th}$ word line WLN is referred to as an $N^{th}$ column selection signal YI@WLN.

Referring to FIG. 5, the enabling moment is different because a write enabling signal EN_WR is delayed based on the address information INF_ADD in this embodiment of the present invention, and accordingly the enabling duration of a data transferred through primary/secondary data transfer lines IO and JOB is controlled differently.

Meanwhile, the first and $N^{th}$ column selection signals YI@WL1 and YI@WLN are enabled at different moments in response to the first memory cell array 320_1 and the $N^{th}$ memory cell array 320_N, respectively. However, since the enabling durations of data transferred through the primary/secondary data transfer lines IO and IOB are different due to the different enabling moment of the write enabling signal EN_WR in this embodiment of the present invention, the data of the primary/secondary data transfer lines IO and IOB (see dotted line) and the $N^{th}$ column selection signal YI@WLN have a sufficient margin, and the data of the primary/secondary data transfer lines IO and IOB (see solid line) and the first column selection signal YI@WL1 have a sufficient margin. After all, the data inputted during a write operation and the column selection signal, which is a control signal for controlling the data inputted during the write operation, have a sufficient margin in accordance with this embodiment of the present invention.

Figure 6:
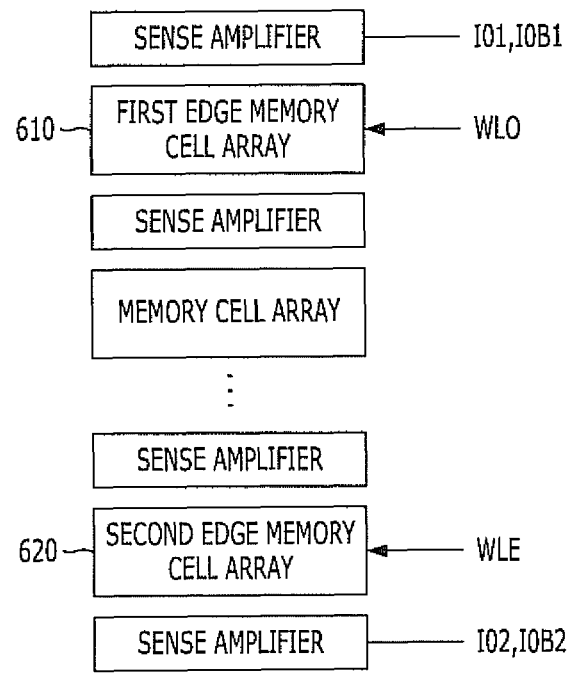
FIG. 6 is a block diagram illustrating a semiconductor memory device in accordance with another embodiment of the present invention.

FIG. 6 is a block diagram illustrating a semiconductor memory device in accordance with another embodiment of the present invention. In the drawing, a semiconductor memory device having an open-bit line structure is taken as an example.

Referring to FIG. 6, the semiconductor memory device having the open-bit line structure includes a plurality of memory cell arrays, and sense amplifiers each disposed between the multiple memory cell arrays. The multiple memory cell arrays are disposed in a predetermined region, and an edge memory cell array is disposed on the outskirt of the predetermined region. The edge memory cell array is coupled with any one bit line between an odd-numbered bit line and an even-numbered bit line. For the sake of convenience in description, it is assumed that a first edge memory cell array 610 is coupled with an even-numbered bit line, and a second edge memory cell array 620 is coupled with an odd-numbered bit line.

Meanwhile, in the semiconductor memory device having the open-bit line structure, first and second word lines WL0 and WLE corresponding to the first edge memory cell array 610 and the second edge memory cell array 620 are simultaneously enabled in response to a row address (not shown) during read and write operations, and an even-numbered data and an odd-numbered data are stored or a stored even-numbered data and a stored odd-numbered data are outputted in response to the enabled first word line WL0 and the enabled second word line WLE, respectively. In other words, first data transfer lines IO1 and IOB1 exchange data with an even-numbered data corresponding to an even-numbered bit line, and second data transfer lines IO2 and IOB2 exchange data with an odd-numbered data corresponding to an odd-numbered bit line. Herein, since the first edge memory cell array 610 and the second edge memory cell array 620 are put apart farthest among the memory cell arrays, the even-numbered data corresponding to the first data transfer lines IO1 and IOB1 and the odd-numbered data corresponding to the second data transfer lines IO2 and IOB2 are transferred to a read sense amplifier at different moments.

Figure 7:
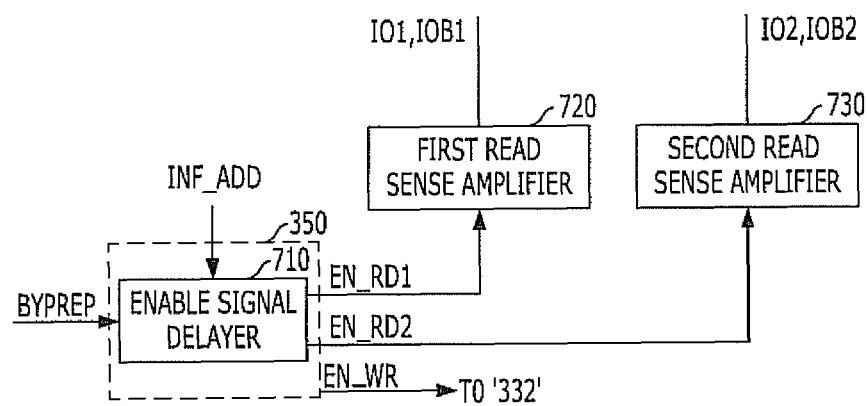
FIG. 7 is a block diagram of a circuit for controlling data transferred through first data transfer lines IO1 and IOB1 and second data transfer lines IO2 and IOB2 shown in FIG. 6.

FIG. 7 is a block diagram of a circuit for controlling data transferred through the first data transfer lines IO1 and IOB1 and the second data transfer lines IO2 and IOB2 shown in FIG. 6. FIG. 7 shows a block corresponding to a read operation, and since a block corresponding to a write operation is similar to the block shown in FIGS. 3 and 4 in terms of structure and operation, description on the block corresponding to a write operation is omitted herein.

Referring to FIG. 7, an enable signal delayer 710 generates a first read enabling signal EN_RD1 and a second read enabling signal EN_RD2 by reflecting the delay amount corresponding to address information INF_ADD into an internal command pulse signal BYPREP. Herein, the address information INF_ADD is address information corresponding to the first edge memory cell array 610 and the second edge memory cell array 620, and the first read enabling signal EN_RD1 and the second read enabling signal EN_RD2 are enabled at different moments based on the address information INF_ADD. Subsequently, a first read sense amplifier 720 receives an even-numbered data transferred though the first data transfer lines IO1 and IOB1, and sense-amplifies the received even-numbered data in response to the first read enabling signal EN_RD1. A second read sense amplifier 730 receives an odd-numbered data transferred though the second data transfer lines IO2 and IOB2, and sense-amplifies the received odd-numbered data in response to the second read enabling signal EN_RD2.

After all, the data outputted from the first edge memory cell array 610 and the second edge memory cell array 620 shown in FIG. 6 are transferred to the first read sense amplifier 720 and the second read sense amplifier 730 shown in FIG. 7 at different moments. However, since the first read enabling signal EN_RD1 and the second read enabling signal EN_RD2 are enabled at different moments based on the address information INF_ADD, the each of the data and the first read enabling signal EN_RD1 and the second read enabling signal EN_RD2 are secured with a sufficient margin.

As described above, the semiconductor memory device in accordance with an embodiment of the present invention may secure a sufficient margin between a data and a control signal for the data. To be specific, a sufficient margin may be secured between the data outputted from a plurality of memory cell arrays and a read enabling signal during a read operation, and a sufficient margin may be secured between the data inputted to the memory cell arrays and a column selection signal during a write operation.

Since it is possible to sufficiently secure an input/output data and a control signal for controlling the input/output data in accordance with an embodiment of the present invention, smooth operation and reliability of a semiconductor memory device may be secured.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a data transfer line coupled with a plurality of memory cell arrays corresponding to an address;
   an enable signal delayer configured to generate an enable signal by reflecting a delay amount corresponding to the address into an internal command signal corresponding to a column command; and
   a data exchange block configured to exchange data with the data transfer line in response to the enable signal.

2. The semiconductor memory device of claim 1, wherein the data exchange block comprises:
   a read sense amplifier for sense-amplifying a data transferred through the data transfer line and outputting a sense-amplified data; and
   a write driver for receiving an external data and driving the data transfer line.

3. The semiconductor memory device of claim 1, further comprising:
   an address decoder configured to select a word line for the multiple memory cell arrays in response to the address.

4. The semiconductor memory device of claim 3, wherein the address is formed of a plurality of bits, and the enable signal delayer delays the internal command signal as much as a delay amount corresponding to a portion of the multiple bits of the address.

5. The semiconductor memory device of claim 2, wherein the enable signal delayer generates a read enabling signal for enabling the read sense amplifier, and a write enabling signal for enabling the write driver.

6. A semiconductor memory device, comprising:
   a data exchange block configured to exchange data with a data transfer line in response to an enable signal;
   a first memory cell array disposed with a first distance from the data exchange block and transferring/receiving data to/from the data transfer line;
   a second memory cell array disposed with a second distance from the data exchange block, where the second distance is longer than the first distance, and transferring/receiving data to/from the data transfer line; and
   an enable signal delayer configured to generate the enable signal by reflecting a delay amount corresponding to the first and second distances into an internal command signal corresponding to a column command.

7. The semiconductor memory device of claim 6, wherein the data exchange block comprises:
   a read sense amplifier for sense-amplifying a data transferred through the data transfer line and outputting a sense-amplified data; and
   a write driver for receiving an external data and driving the data transfer line.

8. The semiconductor memory device of claim 6, further comprising:
   a row address decoder configured to select a word line for the first and second memory cell arrays in response to a row address.

9. The semiconductor memory device of claim 8, wherein the enable signal delayer delays the internal command signal based on the row address.

10. The semiconductor memory device of claim 8, wherein the row address is formed of a plurality of bits, and the enable signal delayer delays the internal command signal as much as a delay amount corresponding to a portion of the multiple bits of the row address.

11. The semiconductor memory device of claim 7, wherein the enable signal delayer generates a read enabling signal for enabling the read sense amplifier, and a write enabling signal for enabling the write driver.

12. A semiconductor memory device, comprising:
   first and second data transfer lines coupled with first and second edge memory cell arrays corresponding to an address;
   an enable signal delayer configured to generate a first enable signal and a second enable signal by reflecting a different delay amount corresponding to the address into an internal command signal corresponding to the column command; and
   a data exchange block configured to exchange data with the first and second data transfer lines in response to the first and second enable signals, respectively.

13. The semiconductor memory device of claim 12, wherein the data exchange block comprises:
   a first read sense amplifier for sense-amplifying data transferred through the first data transfer line in response to the first enabling signal; and
   a second read sense amplifier for sense-amplifying data transferred through the second data transfer line in response to the second enabling signal.

14. The semiconductor memory device of claim 12, further comprising:
   an address decoder configured to select word lines for the first and second memory cell arrays in response to the address.

15. A method for operating a semiconductor memory device, comprising:
   measuring a length of a transfer line between each of a plurality of memory cell array and a data exchange block;
   controlling a delay amount of an internal command signal corresponding to a column command based on the measured value; and
   latching a data corresponding to a memory cell array among the multiple memory cell arrays in response to the internal command signal.

16. The method of claim 15, wherein the delay amount is decided based on an address of each of the multiple memory cell arrays.

* * * * *